United States Patent [19]
Hagberg et al.

[11] Patent Number: 6,049,255
[45] Date of Patent: Apr. 11, 2000

[54] TUNING THE BANDWIDTH OF A PHASE-LOCKED LOOP

[75] Inventors: Hans Hagberg, Malmö; Leif Magnus André Nilsson, Lund, both of Sweden

[73] Assignee: Telefonaktiebolaget LM Ericsson, Stockholm, Sweden

[21] Appl. No.: 09/090,914

[22] Filed: Jun. 5, 1998

[51] Int. Cl.[7] .................................................. H03L 7/085
[52] U.S. Cl. .................................. 331/17; 331/25; 331/44
[58] Field of Search ............................... 331/1 R, 17, 25, 331/44

[56] References Cited

U.S. PATENT DOCUMENTS

| | | | |
|---|---|---|---|
| 4,691,176 | 9/1987 | Hsiung et al. | 331/2 |
| 4,771,249 | 9/1988 | Burch et al. | 331/17 |
| 4,926,141 | 5/1990 | Herold et al. | 331/16 |
| 5,233,314 | 8/1993 | McDermott et al. | 331/17 |
| 5,295,079 | 3/1994 | Wong et al. | 364/484 |
| 5,448,763 | 9/1995 | Gillig | 455/76 |
| 5,631,587 | 5/1997 | Co et al. | 327/107 |
| 5,703,539 | 12/1997 | Gillig et al. | 331/16 |

OTHER PUBLICATIONS

A. J. Bishop, et al. "Adaptive Phase Locked Loop for Video Signal Sampling," 1992 IEEE International Symposium on Circuits and Systems, San Diego, CA, May 10–13, 1992, vol. 4 of 6, May 10, 1992, pp. 1664–1667.

R. C. Den Dulk, "Digital PLL Lock–Detection Circuit," Electronic Letters, vol. 24, No. 14, Jul. 7, 1988, pp. 880–882.

Primary Examiner—Siegried H. Grimm
Attorney, Agent, or Firm—Burns, Doane, Swecker & Mathis, L.L.P.

[57] ABSTRACT

A phase-locked loop bandwidth is tuned to a desired level by operating the phase-locked loop in a phase-locked condition at a first frequency and applying a step response to the phase-locked loop by causing the phase-locked loop to begin locking to a second frequency that is different from the first frequency. A parameter is then detected that is related to the applied step response and that is indicative of whether the phase-locked loop bandwidth is at the desired level. The phase-locked loop bandwidth is adjusted, and the steps of operating at the first frequency, applying the step response, detecting the parameter and adjusting the phase-locked loop bandwidth are repeated until the phase-locked loop bandwidth is at the desired level. Where the desired bandwidth level for tuning is not the operational bandwidth, the phase-locked loop bandwidth is further adjusted by a predetermined amount, thereby tuning the phase-locked loop bandwidth to an operational level. The step response may be applied by changing a frequency division value in a feedback path of the phase-locked loop. The detected parameter may be a pulse skip, which indicates that the bandwidth of the phase-locked loop is not yet at the desired bandwidth level.

34 Claims, 10 Drawing Sheets

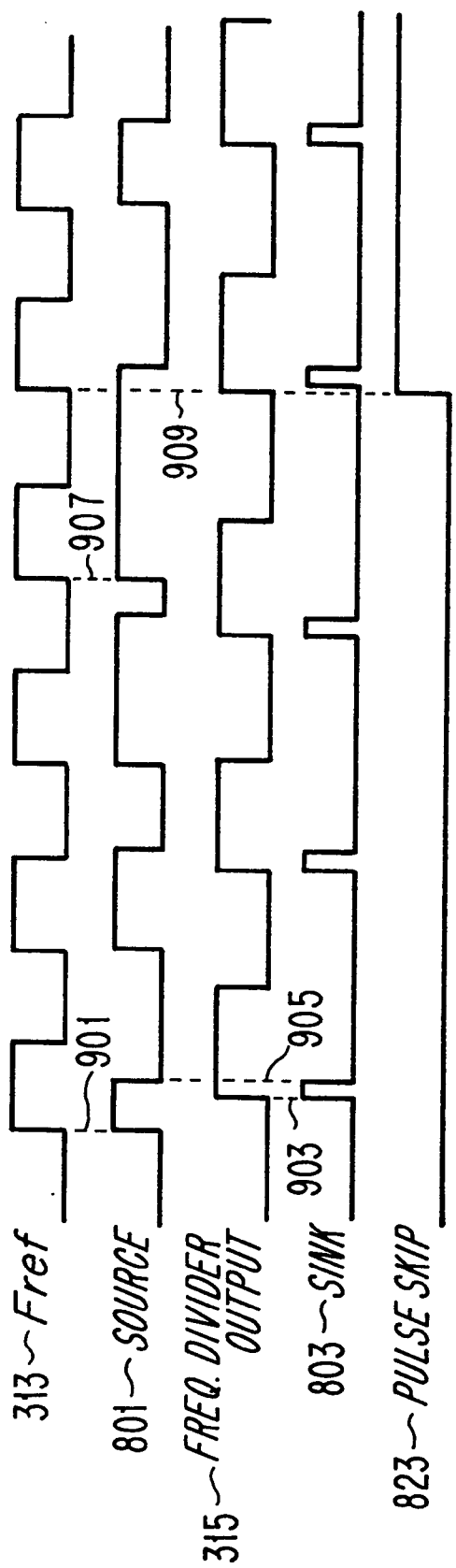

TUNING THE BANDWIDTH OF A PHASE-LOCKED LOOP

BACKGROUND

The present invention relates to phase-locked loops (PLL), and more particularly to the measurement and tuning of phase-locked loop bandwidths.

Phase-locked loops (PLL) are known in the art, and have been applied to solve many types of problems. An exemplary use of a PLL is as part of a prefiltered Sigma Delta Controlled Fractional-N modulator, which generates continuous phase modulation. A prefiltered Sigma Delta Controlled Fractional-N modulator is depicted in FIG. 1. A reference signal 101 is fed to a phase detector 102 together with the phase of the output of a frequency divider 106. The reference signal 101 is preferably a sinusoidal signal having a frequency denoted by $f_{ref}$. The output of the phase detector 102 is a pulse that is related to the phase difference between the reference signal 101 and the output of the frequency divider 106. The output of the phase detector 102 is fed to a charge pump 103 and then filtered by a loop filter 104. The output of the loop filter 104 is then applied to a voltage controlled oscillator (VCO) 105. The output signal of the VCO 105 is supplied to the input of the frequency divider 106. As a result of this feedback arrangement, the output frequency of the VCO 105 is driven to equal the frequency of the reference signal 101 times the division factor of the frequency divider 106. Hence, the frequency of the VCO 105 can be controlled by controlling the division factor of the frequency divider 106. In a Sigma Delta controlled fractional-N PLL modulator, the division factors are generated by a baseband component 107 that includes a Sigma Delta modulator and a prefilter. The input of the baseband component 107 receives the data 108 that serves as the modulating signal.

The prefiltered Sigma Delta Controlled Fractional-N modulator is reliant on a very good match between the prefilter in the baseband component 107 and the PLL bandwidth. The introduction of some form of mismatch results in a severe increase of the root means square (rms) phase error of the modulated signal. Therefore, it is of great importance to have a tight control over the PLL bandwidth, in order to prevent it from moving from its desired value, as determined by the prefilter.

The main cause of variability of the bandwidth of a PLL is the VCO gain (i.e., the ratio of output frequency to input control voltage). As shown in the graph depicted in FIG. 2, a VCO's gain-frequency relationship is such that gain decreases significantly with frequency, thereby making the open loop gain of the PLL also decrease with frequency. A further consequence of this VCO characteristic is that the bandwidth of the PLL varies as a function of the operating frequency. In the PLL, this variation of VCO gain (and consequent variation of open loop gain) is compensated for by means of the controllable charge pump 103.

This compensation cannot be performed unless the gain-frequency relationship is known. However, the gain-frequency relationship will vary for different VCO samples and different operating temperatures. In FIG. 2, this variability is illustrated by the dotted lines 201 and 203. In practice, an initial tuning of the PLL must be performed that takes into account the actual gain-frequency relationship of the "unknown" VCO.

U.S. Pat. No. 5,295,079 describes an apparatus for testing different parameters for a PLL. The digital tester is connected to the PLL via a data bus controlled by an I/O controller. The PLL cannot be an ordinary PLL, but must instead be designed to include several "access ports" such as a frequency access port, loop configuration port, phase access port, and a phase error processor. This document describes determining acquisition time and cycle slipping by applying an input data pattern at the reference input of the loop. This document also describes two methods for determining frequency response of a PLL. One is to apply an input data pattern at the reference input to the PLL. A second method is to use "internal excitation", which is created by using the frequency access port which has control of the input control signal to the VCO. This document does not describe any technique for adjusting the loop bandwidth by using the results from the testing of the loop.

U.S. Pat. No. 5,703,539 describes an apparatus and method for varying the loop bandwidth in a PLL in order to, for example, provide a shorter lock time, improved noise performance and lower spuriousness, when the input frequency or the division factor in the loop changes. A loop bandwidth controller is provided to indicate how close the loop is to being locked. As the loop gets close to locked, a different loop bandwidth state may be desirable to converge the output frequency signal to the reference signal. This document does not cover any methods for determining and tuning the loop bandwidth to compensate for varying VCO gain-frequency relationships, however.

U.S. Pat. No. 5,631,587 discloses adjusting the loop gain in a PLL by either controlling the charge pump or the parameters of the loop filter. As input for adjusting the bandwidth of the loop, the division factor in the loop (N) and the division factor in front of the loop (M) are used. This means that a precalculated value is stored in the adjustment circuit corresponding to the division factors used at any given moment in the loop. The precalculated value corresponding to the current division factor is then applied to the loop. Essentially, this means that there is no capability for adjusting the loop bandwidth dependent on variations of an "unknown" VCO gain in the loop. Instead, the proposed method simply expects a known or constant VCO gain.

U.S. Pat. No. 4,691,176 deals with the problem of adjusting the bandwidth of tracking loops to accomplish the best performance for the current signal entering the loop. The information on which the loop bandwidth adjustment is made is the rate and magnitude of phase or frequency fluctuations of the input signal. The bandwidth of the loop is then adjusted in response to an estimated decorrelation time in order to optimize the performance of the signal tracking. This adjustment is more or less performed in real time (i.e., during operation of the loop) by means of a complex algorithm.

U.S. Pat. No. 5,448,763 describes a way of using channel spacing in a communication system to adjust the loop bandwidth in the synthesizer PLL of a receiver. A processor is used to determine the channel spacing and the loop is set to be "wide" or "narrow" as a function of the determined channel spacing. This adjustment procedure is performed to provide the synthesizer with faster lock time and lower noise. The disclosed technique only adjusts the loop bandwidth based on information about the input signal to the PLL (via the microprocessor), meaning that the uncertainties about the gain in the loop are not taken into consideration.

SUMMARY

It is therefore an object of the present invention to provide methods and apparatus for indicating and/or tuning the bandwidth of a phase-locked loop.

The foregoing and other objects are achieved in methods and apparatus for indicating the bandwidth of a phase-locked loop, and for tuning the phase-locked loop bandwidth to a desired level. In accordance with one aspect of the invention, this is accomplished by operating the phase-locked loop in a phase-locked condition at a first frequency and then applying a step response to the phase-locked loop by causing the phase-locked loop to begin locking to a second frequency that is different from the first frequency. Then, a parameter is detected that is related to the applied step response and that is indicative of whether the phase-locked loop bandwidth is at the desired level. The phase-locked loop bandwidth is adjusted, and process is repeated until the phase-locked loop bandwidth is at the desired level.

In another aspect of the invention, after the phase-locked loop is at the desired level, the phase-locked loop bandwidth is further adjusted by a predetermined amount, thereby tuning the phase-locked loop bandwidth to an operational level. This is possible, for example, in embodiments in which the bandwidth adjustment is made by adjusting the output current levels of a controllable charge pump in the phase-locked loop, where the controllable charge pump is adjustable in steps that are logarithmically spaced with respect to one another.

In yet another aspect of the invention, the act of applying the step response to the phase-locked loop comprises changing a frequency division value in a feedback path of the phase-locked loop.

In still another aspect of the invention, the act of detecting the parameter that is related to the applied step response comprises detecting whether a pulse skip occurs.

In yet another aspect of the invention, the act of adjusting the phase-locked loop bandwidth and repeating the previously performed steps until the phase-locked loop bandwidth is at the desired level comprises adjusting the phase-locked loop bandwidth and repeating the previously performed steps until no pulse skip is detected when the step response is applied to the phase-locked loop.

In still another aspect of the invention, a pulse skip may be detected by detecting whether two leading edges of a phase-locked loop reference frequency signal occur in succession without an occurrence of a leading edge of a phase-locked loop feedback signal. In an alternative embodiment, pulse skip detection includes detecting whether two leading edges of a phase-locked loop feedback signal occur in succession without an occurrence of a leading edge of a phase-locked loop reference frequency signal. In some embodiments, these alternative pulse skip detection techniques may be performed in parallel.

In an alternative embodiment of the invention, detecting the parameter that is related to the applied step response comprises detecting whether a predetermined number of pulse skips occur, wherein the predetermined number is greater than one. This aspect may be combined with other of the above-described aspects of the invention.

Any and all of the abovedescribed, as well as other, aspects of the invention may be embodied in methods and/or apparatus for detecting when a phase-locked loop is no longer tuned and/or for tuning the phase-locked loop. Aspects of the invention may also be embodied as a computer usable storage medium having computer readable program code means embodied therein for causing a computer to control operation of the variously described phase-locked loop tuning techniques.

BRIEF DESCRIPTION OF THE DRAWINGS

The objects and advantages of the invention will be understood by reading the following detailed description in conjunction with the drawings in which:

FIG. 9 illustrates exemplary waveforms that might be generated in a phase-locked loop as a result of an applied frequency step, in accordance with one aspect of the invention.

DETAILED DESCRIPTION

Figure 1:
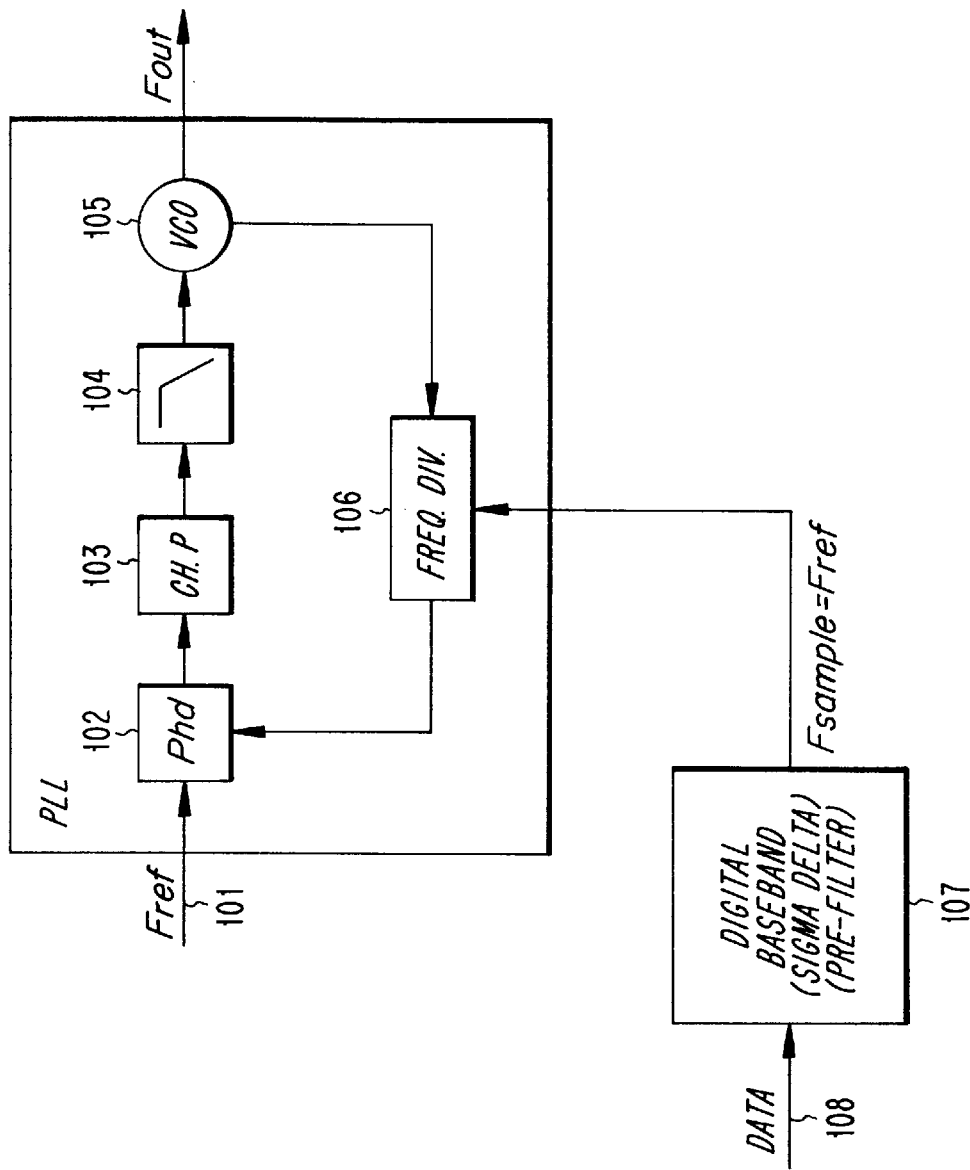
FIG. 1 is a block diagram of a prefiltered Sigma Delta Controlled Fractional-N modulator.
Figure 2:
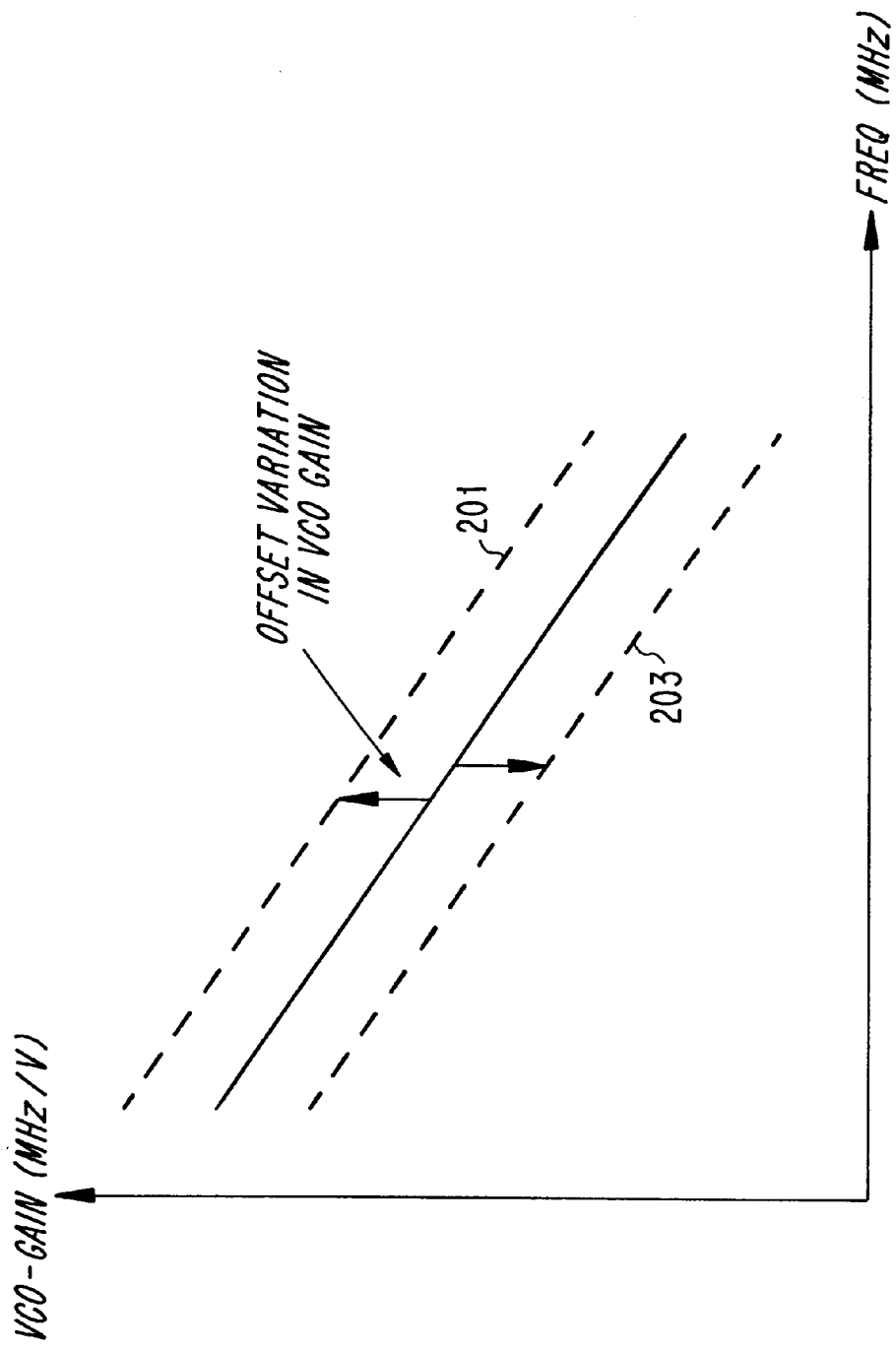
FIG. 2 is a graph showing a VCO's gain-frequency relationship.

The various features of the invention will now be described with respect to the figures, in which like parts are identified with the same reference characters.

Figure 3:
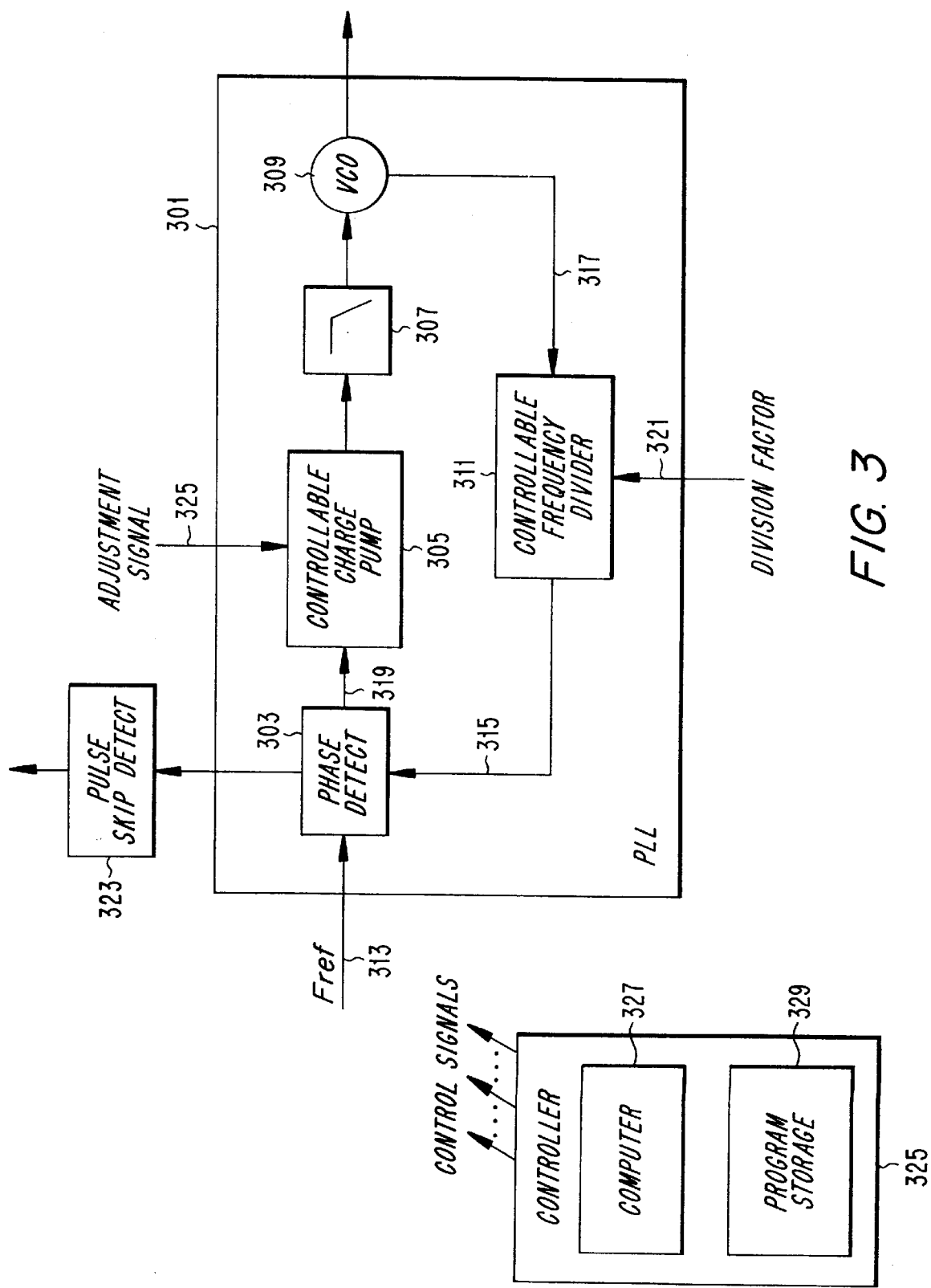
FIG. 3 is a block diagram of an exemplary arrangement for practicing the invention.

An exemplary arrangement for practicing the invention is depicted in FIG. 3. The arrangement includes a phase-locked loop (PLL) 301 whose bandwidth is to be tuned. The PLL 301 includes a phase detector 303, whose output is supplied to a charge pump 305 that is controllable in discrete steps, preferably with $\log_2$ spacing between the current steps. The remaining components of the PLL 301 are those that are typically found in a PLL, that is, a loop filter 307, a VCO 309 and a feedback path that includes a controllable frequency divider 311. In accordance with one aspect of the invention, the bandwidth of the PLL 301 is tuned by generating a step response in the PLL 301 and then measuring or detecting one or more parameters that, as a result of the step response, are related to the bandwidth of the loop. One or more loop elements may then be adjusted, utilizing the measured/detected parameter as a guide.

A step response may be generated by switching the division factor in the frequency divider 311.

One parameter that is well suited for indicating the bandwidth of the loop is the occurrence, or lack thereof, of a "pulse skip" in the phase detector 303 when a suitable step response is applied to the PLL 301. As used throughout this specification, the term "pulse skip" refers to the occurrence of a type of phase difference between the output signal of the frequency divider 311 and the reference signal, which phase difference is in the magnitude of a complete cycle of the reference frequency signal. When this magnitude phase difference occurs, two consecutive leading edges of the reference signal will occur without the occurrence of a leading edge of the frequency divider output signal. This is shown in more detail in the timing diagrams of FIGS. 4a and 4b.

Figure 4A:
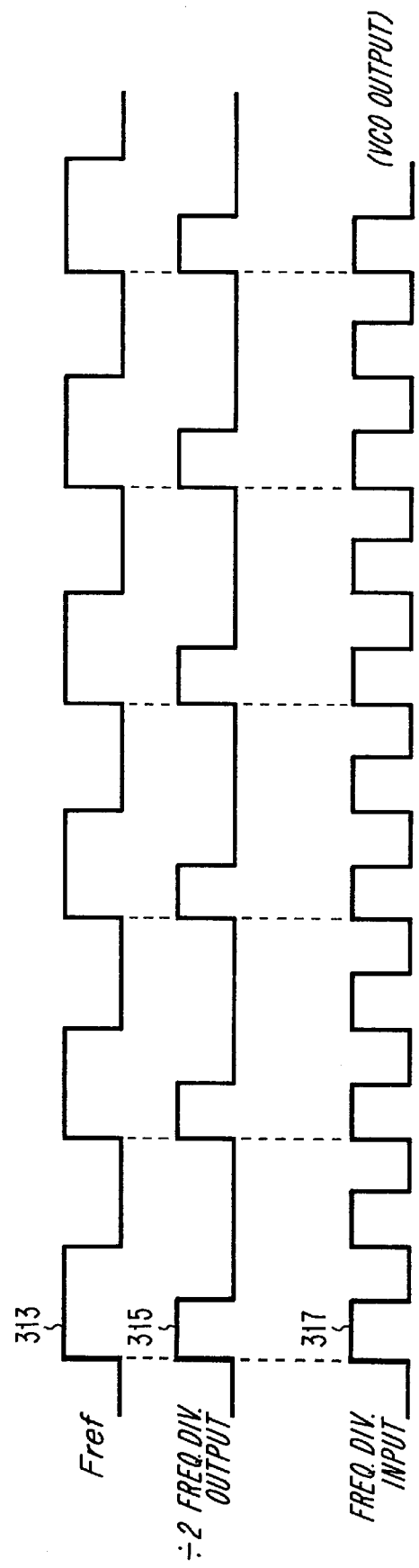
FIGS. 4a and 4b are timing diagrams depicting signals in the phase-locked loop with and without an applied step response that causes a pulse skip.

Referring first to FIG. 4a, this is a timing diagram of three signals present in the PLL 301: a reference frequency, Fref 313; a frequency divider output signal 315; and a frequency divider input signal 317 (which is also the VCO output signal). The situation illustrated in FIG. 4a is one in which the loop is in a phase-locked condition, with the frequency divider performing a divide by two operation. This is evident from the fact that there are two cycles of the frequency divider input signal 317 for every one cycle of the frequency divider output signal 315.

Figure 4B:
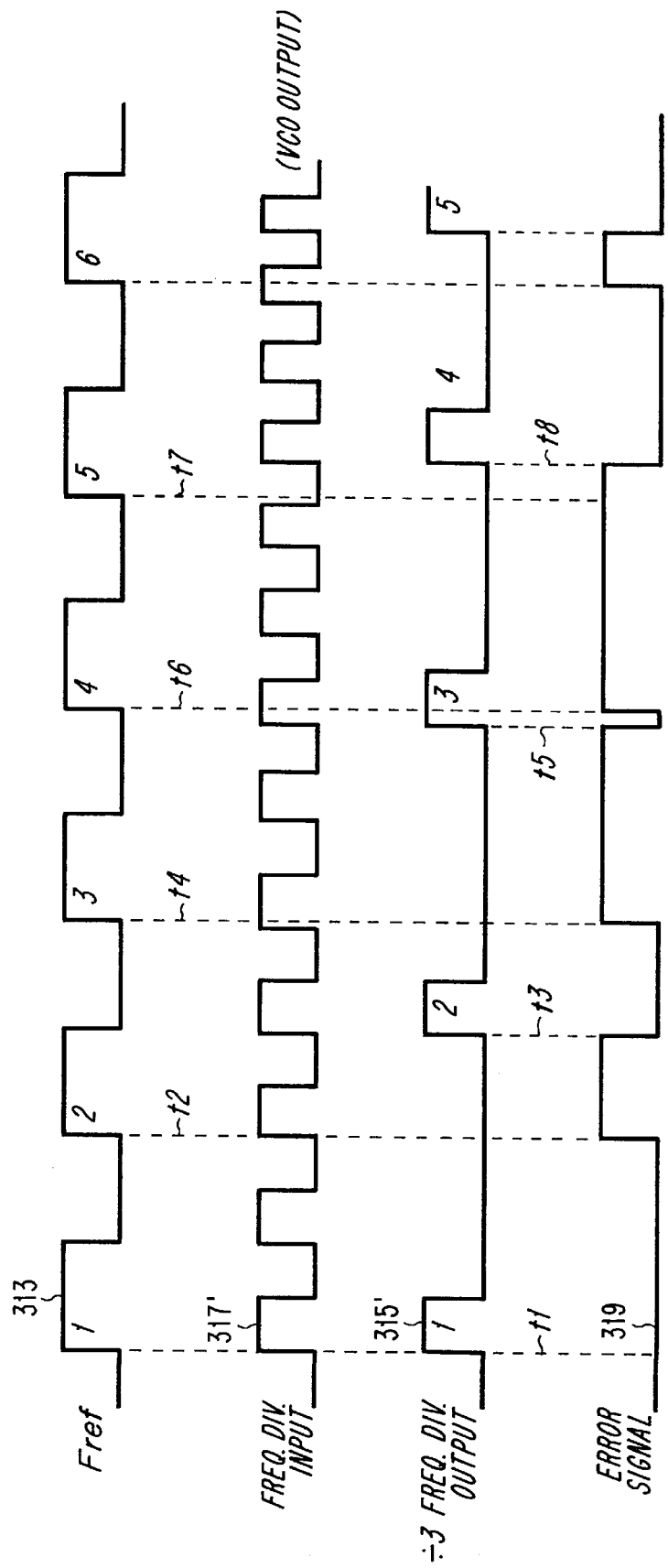

FIG. 4b illustrates the effect of introducing a step response into the PLL 301 at a time when it had been phase-locked as illustrated in FIG. 4a. In this example, this is performed by changing the division factor from two to three. At the moment, t1, of the change in division factors, the Fref signal 313 and frequency divider output signal 315' are still substantially phase-aligned, so the error signal pulse 319 generated at the output of the phase detector 303 is negligible. However, as a result of the change, the frequency divider output signal 315' has one cycle for every three cycles of the frequency divider input signal 317'. As a result, the second flank of the Fref signal 313 occurs at time t2, while the second flank of the frequency divider output signal 315' occurs sometime later, at t3. This difference in phase causes a more substantial error signal pulse 319 to be asserted, whose duration is proportional to the phase difference between the second flank of the Fref signal 313 and the second flank of the frequency divider output signal 315'.

The effect of the error signal pulse 319 in the PLL 301 is to cause the VCO output frequency to increase, as can be seen in the figure. The adjustment to the VCO output frequency is not enough to immediately cause the frequency divider output signal 315' and the Fref signal 313 to be phase aligned, so there is an even more substantial phase difference between the third flank of the Fref signal 313 (time t4) and the third flank of the frequency divider output signal 315' (time t5).

The resultant error signal pulse 319 causes a further increase in the VCO output frequency, but in this example this is still not enough to bring the Fref signal 313 and the frequency divider output signals 315' into phase alignment. To the contrary, the phase difference between these two signals has grown to the extent that the fourth and fifth flanks of the Fref signal 313 occur at times t6 and t7, respectively, without any intervening flank of the frequency divider output signal 315', which does not occur until a still later time t8. This is the pulse skip referred to in this disclosure.

Figure 5:
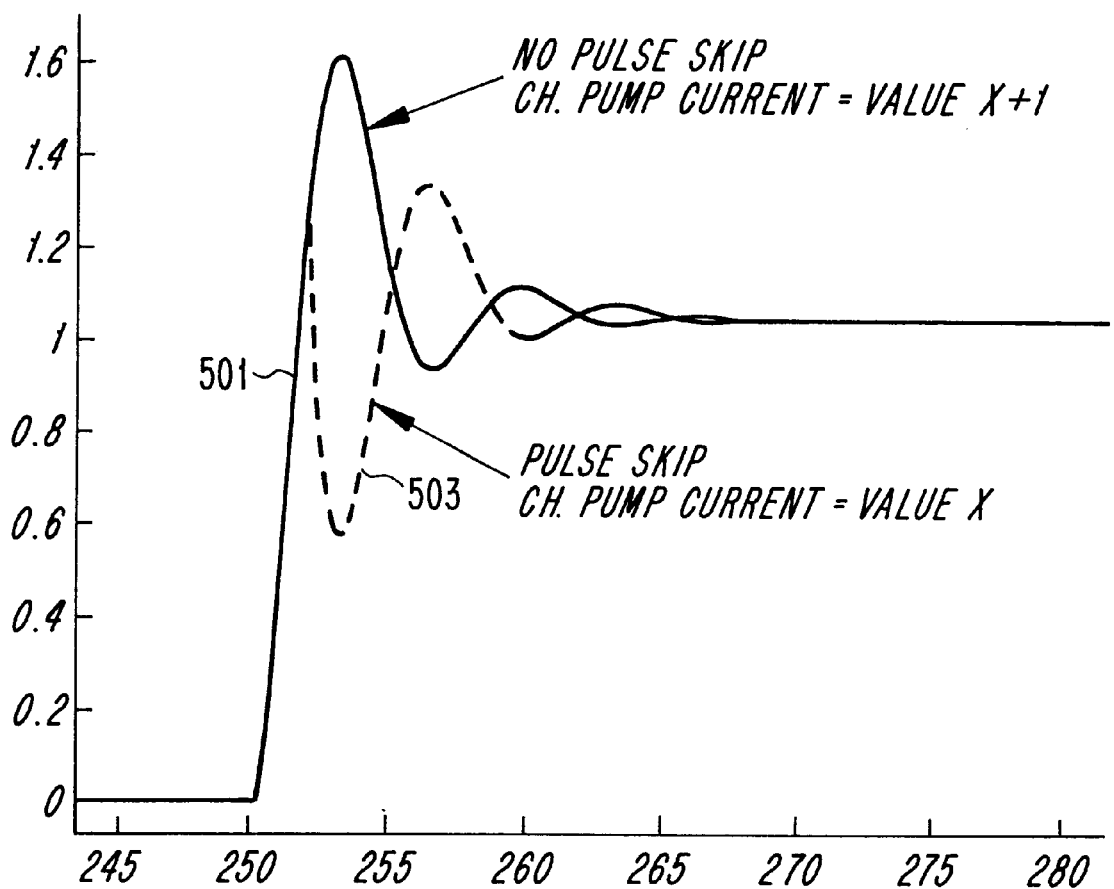
FIG. 5 is a graph showing an exemplary frequency step at the control input to the VCO 309, with and without a pulse skip when a step response is applied to the PLL 301 in accordance with one aspect of the invention.

FIG. 5 is a graph showing an exemplary frequency step at the control input to the VCO 309 with and without a pulse skip when the above-described step response is applied to the PLL 301. Without the pulse skip (graph 501), the applied voltage is large enough to enable the VCO 309 to quickly respond to the change (increase) in the division factor. When the pulse skip occurs however (graph 503), the voltage reaches a lower maximum value, followed by a pronounced voltage dip (corresponding to the low level of the error signal 319 that occurs at time t8; see FIG. 4b). As a result, the VCO 309 is slower to respond to the change in the division factor.

Returning now to the issue of tuning the bandwidth of the PLL, this is performed in an exemplary embodiment by changing the division factor 321 by a large enough step (compared to the current loop bandwidth) in order to cause a pulse skip to occur in the phase detector 303. In another aspect of the invention, a pulse skip detector 323 is coupled to the phase detector 303. The pulse skip detector 323 generates a logic level (e.g., a logical "1") to indicate the presence of a pulse skip. By incorporating the pulse skip detector 323 on the same integrated circuit as the PLL 301, the pulse skip logic level can be brought out to an output pin, thereby permitting bandwidth tuning to be performed without the need for manual probing of loop elements.

In accordance with the invention, after a given division factor change is known to cause a pulse skip in the PLL 301, the division factor is reset to its initial value, the charge pump output current is increased (by means of adjustment signal 325), and the same division factor change is again applied. By increasing the charge pump output current, the bandwidth of the loop is increased. The process is repeated so long as the same division factor change continues to cause a pulse skip to occur notwithstanding the increase in charge pump output current. The process is stopped when the charge pump output current has been increased to the point at which the applied step response no longer causes a pulse skip to occur. At this point, the size of the adjusted charge pump current together with the "unknown" VCO gain sets the desired open loop gain in the loop and thereby also sets the desired bandwidth of the loop.

The PLL tuning technique described above utilizes frequency steps (i.e., the step response induced when the division factor is increased by a value of 1) that are in the magnitude of the reference frequency and multiples of it. As a consequence, the tuned PLL may not be the desired operating bandwidth. In accordance with another aspect of the invention, this problem is addressed by tuning the PLL 301 as described above, and then adjusting the output of the charge pump 305 so as to translate it to be in range for the operating bandwidth. The adjustment may be performed by subtracting a known current offset (i.e., a known number of current steps) from the value achieved at the end of the above-described tuning process.

Figure 6:
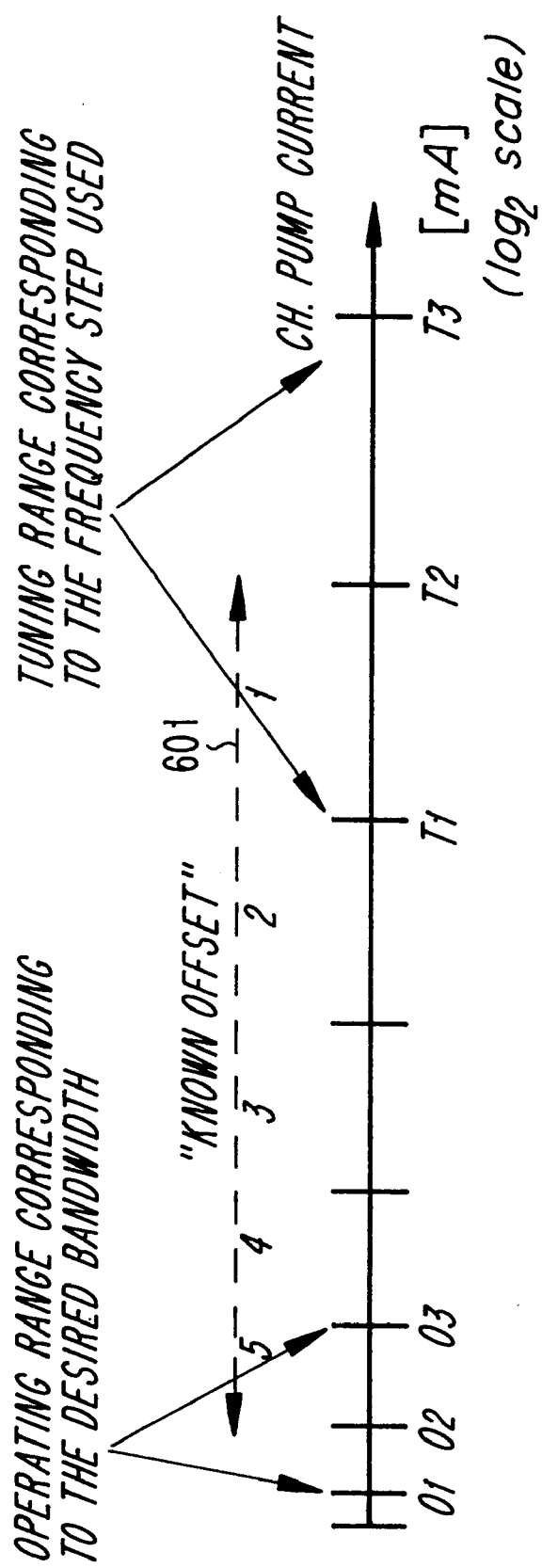
FIG. 6 is a graph showing a further adjustment of a charge pump output current, in accordance with one aspect of the invention.

This aspect is illustrated in FIG. 6, which shows the $\log_2$ scale of an exemplary output current of the controllable charge pump 305. In this example, the current T1 is applied to the charge pump 305 and the frequency step is applied as described above. If a pulse skip occurs, the charge pump current is stepped up one step to T2, and the procedure is repeated. Assume that the pulse skip again occurs, resulting in the charge pump current being stepped up one more time to T3. If no pulse skip is detected when the frequency step is again applied, the PLL 301 is tuned, but not to the desired operational bandwidth. Adjustment to the desired bandwidth is performed by adjusting the charge pump current from its "tuned" value of T3 downward by a known offset amount. In this example, the known offset is assumed to be five steps, resulting in an operating charge pump current value of O3. This will be the correct operating current value for the PLL 301. In general, if tuning of the PLL 301 had resulted in any of the charge pump current values in the range from T1 to T3, adjustment by the known offset amount would result in a corresponding one of the charge pump current values in the range from O1 to O3, as shown in FIG. 6. The $\log_2$ scale of the charge pump current assures that the change in bandwidth of the loop will be equally large for each charge pump step over the complete charge pump current range. Consequently, no accuracy is lost as a result of the translation that is performed to adjust the tuned PLL 301 to the operating bandwidth.

The known offset value is preferably determined once, with the value then being used for the tuning of all PLLs that are to use the same operating bandwidth. The offset value may be calculated, although it is more easily measured, either physically or by means of a simulator.

Figure 7:
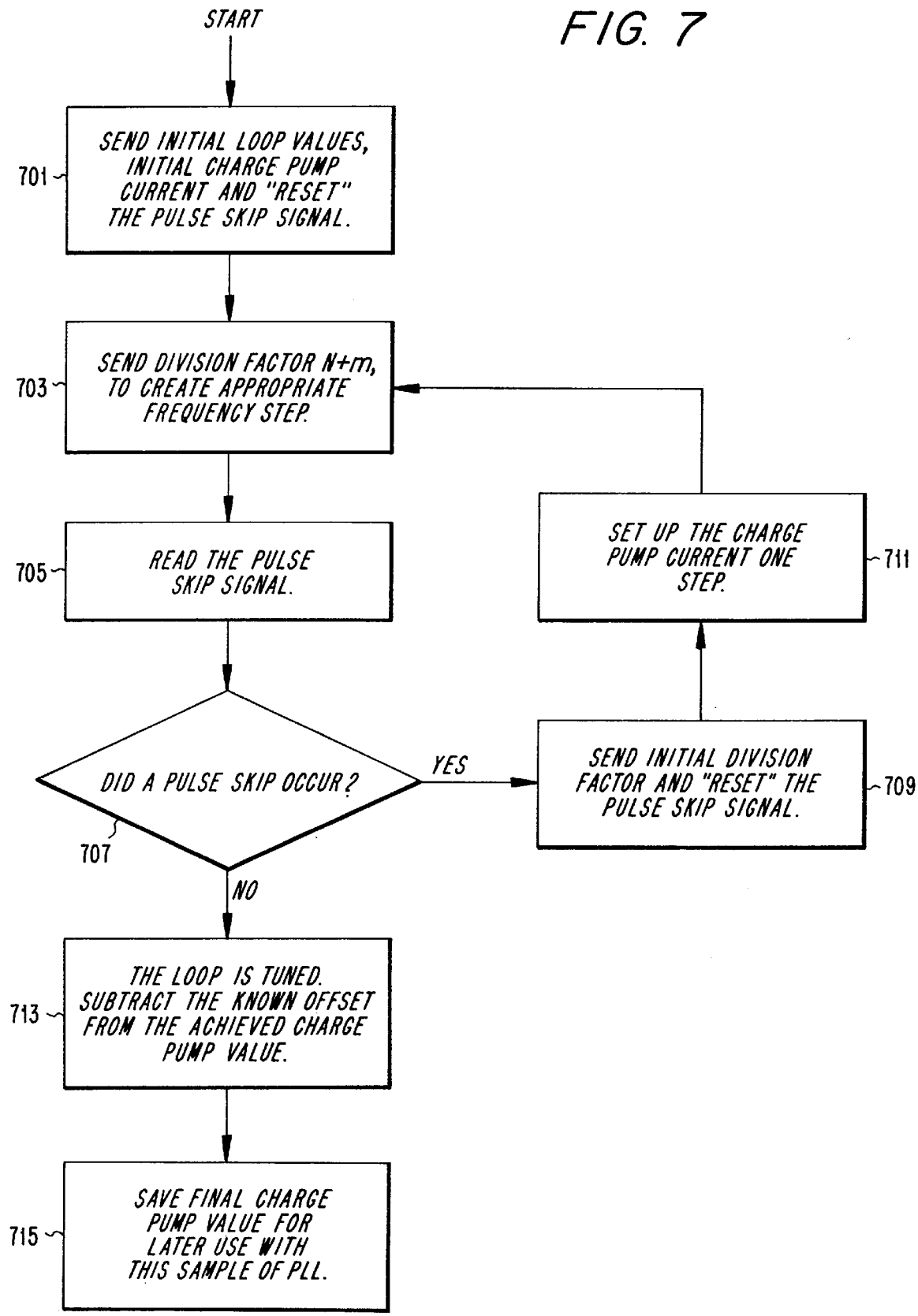
FIG. 7 is a flow chart depicting the steps of a method for tuning a PLL in accordance with one aspect of the invention.

The above-described PLL tuning method is particularly well suited to being controlled by an automated process (e.g., by means of a suitably programmed processor) because the pulse skip detector 323 need only output a binary result (e.g., "1" if a pulse skip is detected, "0" if no pulse skip is detected), which makes for easy decision points. FIG. 7 is a flow chart depicting the steps of a method for tuning a PLL, which steps may be implemented by means of a controller, such as the controller 325 depicted in FIG. 3, which comprises a computer 327 executing instructions that are stored in a computer-readable storage medium 329, such as a random access memory (RAM), magnetic storage medium, compact disk read-only memory (CD ROM), and the like.

In accordance with the exemplary control method, the PLL 301 is initialized (step 701). This includes setting a first division factor, N, and an initial charge pump value, and allowing the PLL 301 to achieve a phase-locked condition. Furthermore, the pulse skip detector 323 is reset, so that it is ready to detect a next pulse skip, with its output indicating no pulse skip until the occurrence of such a detection.

After the loop has locked onto a frequency determined by the reference frequency (Fref) and the first division factor, N, a frequency step is introduced into the loop by applying a new division factor, N+m (step 703). A value for 'm' may, for example, be 1 or 2, and is ultimately a function of the particular system components and the desired bandwidth. After a suitable amount of time (determined by the reference frequency, the division factor and the current loop bandwidth), the pulse skip signal is read from the output port of the pulse skip detector 323 (step 705). If the pulse skip signal indicates that a pulse skip occurred ("yes" path out of decision block 707), then the division factor is reset to its initial value, N, and the pulse skip detector 323 is reset, so that it is again ready to detect a next pulse skip (step 709). The controllable charge pump 305 is then adjusted so that its output current is increased one step (step 711).

The control loop is then repeated, starting at step 703, until a frequency step is applied without the occurrence of a consequent pulse skip ("no" path out of decision block 707). At this point, the loop is tuned. Assuming that it is tuned to a bandwidth other than the desired operational bandwidth, the controllable charge pump 305 is adjusted by a known amount (e.g., by reducing the achieved charge pump output current value by a known value), as described earlier, in order to achieve the desired operational bandwidth (step 713). The finally achieved charge pump output current value is preferably stored so that it may be reused with this particular PLL 301 (step 715). Reuse of the finally achieved charge pump output current value is especially useful when the PLL 301 associated with the stored value is to be operated at the same temperature as that under which the bandwidth of the PLL 301 was tuned.

In order to perform the post-tuning bandwidth adjustment that has just been described, the current range of the controllable charge pump 305 should be wide enough to span from the operating range to the tuning range. This requirement may be more easily satisfied by practicing the invention in accordance with an alternative embodiment in which several pulse skips are used as an indication of the bandwidth, rather than just one pulse skip. For example, the bandwidth indication can be performed by first counting the number, X, of pulse skips that occur when the frequency step is first applied. This may be performed, for example, by manually probing an exemplary PLL with measurement equipment, and then using the same measured value for all subsequently tuned PLLs. Then, the charge pump current is increased until only X-1 pulse skips occur when the frequency step is applied. An alternative technique for performing this last step is to increase the charge pump current until fewer than X pulse skips occur when the frequency step is applied. The PLL 301 is then tuned, subject to a possible adjustment to an operating bandwidth as described above. This technique permits small PLL bandwidths to be tuned without requiring such a wide adjustable charge pump current range.

Figure 8:
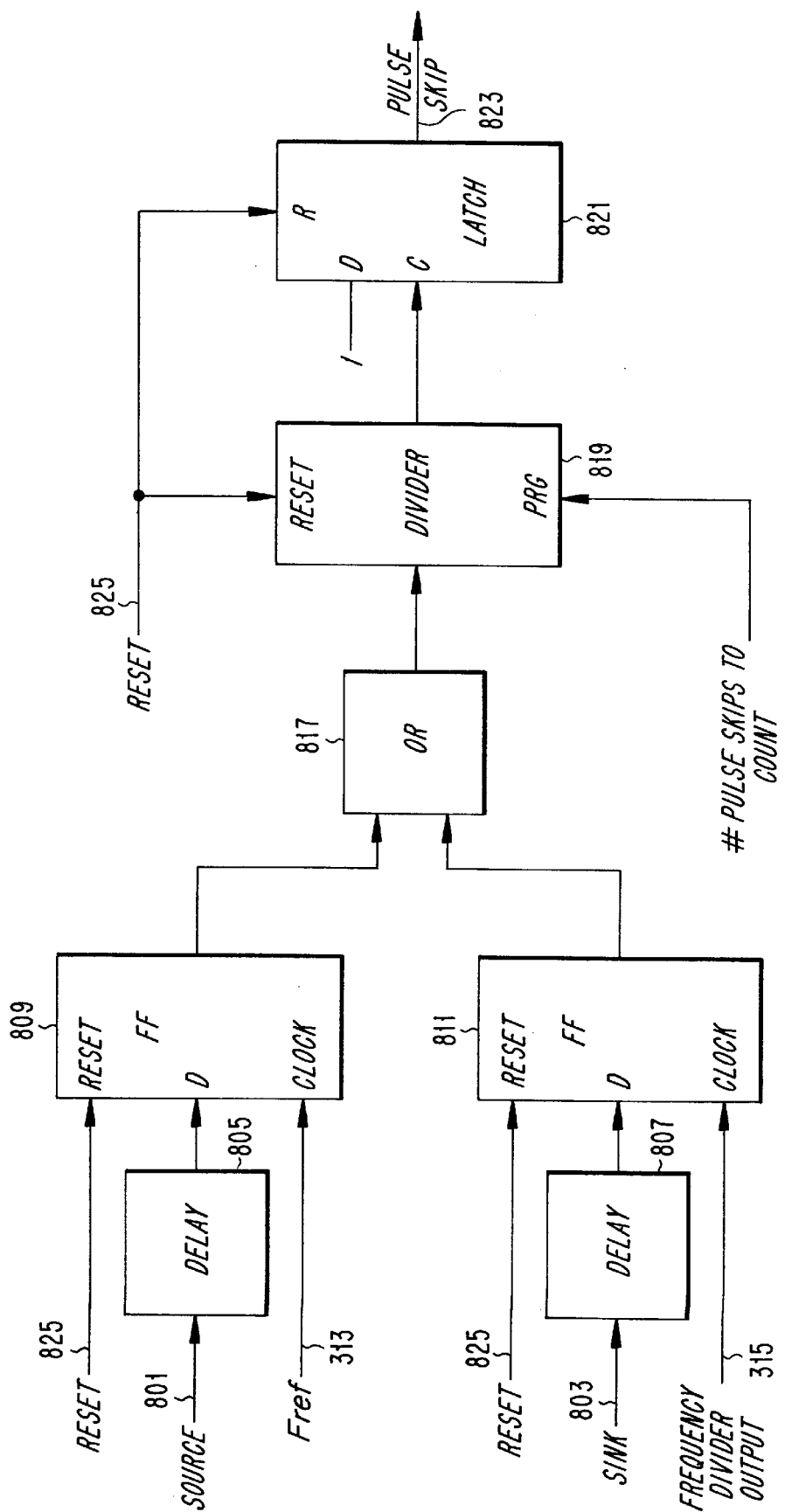
FIG. 8 is a block diagram of an exemplary embodiment of a pulse skip detector in accordance with one aspect of the invention.

An exemplary embodiment of a pulse skip detector that may be used with any of the above-described embodiments will now be described with reference to FIG. 8. In this embodiment, the output from the phase detector 303 is assumed to actually comprise two signals: the SOURCE signal 801 and the SINK signal 803. The SOURCE signal 801 is asserted in response to the occurrence of a leading edge of the Fref signal 313. The SINK signal 803 is asserted in response to the occurrence of a leading edge of the frequency divider output signal 315. In response to both the SOURCE and the SINK signals 801, 803 being simultaneously active, logic in the phase detector 303 resets them.

The SOURCE and SINK signals 801, 803 are respectively applied to the inputs of first and second delay blocks 805, 807. The delay blocks 805, 807 introduce a relatively small delay, compared with the frequency of the reference frequency signal 313. For example, the reference frequency signal 313 may have a 77 nanosecond period (corresponding to a frequency of 13 megahertz), compared to a delay of 0.5 nanosecond introduced by each delay block 805, 807. The purpose of this delay is to avoid the possibility of not detecting the occurrence of a pulse skip, which could happen, for example, if the SOURCE signal 801 were deasserted at the exact same moment as a next rising edge of the Fref signal 313. The delay blocks 805, 807 may be implemented by, for example, a suitably sized capacitor and resistor connected in parallel.

The delayed signals supplied at the outputs of the first and second delay blocks 805, 807 are then sampled by respective first and second flip-flops 809, 811. The first flip-flop 809 is clocked by the reference frequency signal, Fref 813, while the second flip-flop 811 is clocked by the frequency divider output signal 315. Each of the first and second flip-flops 809, 811 looks for a particular signal combination that is indicative of the occurrence of a pulse skip. In the case of the first flip-flop 809, it is the occurrence of a leading (clocking) edge of the Fref signal 313 at a time when the (delayed) SOURCE signal 801 is still asserted from a previously occurring leading edge of the Fref signal 313. With respect to the second flip-flop 811, it is the occurrence of a leading (clocking) edge of the frequency divider output signal 315 at a time when the (delayed) SINK signal 803 is still asserted from a previously occurring leading edge of the frequency divider output signal 315.

The outputs of the first and second flip-flops 809, 811 are then combined in an OR-gate 817, whose output indicates the detection of a pulse skip. The output of the Or-gate 817 is supplied to a divider 819, which has been programmed to divide by the number of pulse skips to be counted (i.e., the number X as described above with respect to the alternative PLL tuning technique). When the divider 819 has counted the programmed value, its output switches on a latch 821, whose output is supplied as the pulse skip signal 823. A reset signal 825 is suppled to the two flip-flops 809, 811, the divider 819, and the latch 821 so that the pulse skip detector 323 can be reset for a next use.

FIG. 9 illustrates exemplary waveforms that might be generated in the PLL 301 as a result of an applied frequency step, where the number of pulse skips to be counted, X, is equal to one. At point 901, the rising edge of the Fref signal 313 causes the SOURCE signal 801 to be asserted. At point 903, the rising edge of the frequency divider output signal 315 causes the SINK signal 803 to be asserted. The simultaneous assertion of both the SOURCE and SINK signals 801, 803 causes (after a small delay) each of these to be deasserted (at point 905). In this example, the frequency divider output signal 315 has a lower frequency than that of the Fref signal 313. Consequently, the first three illustrated reference cycles are "normal" in the sense that they operate as described above with respect to the first reference cycle (i.e., the leading edge of the frequency divider output signal 315 occurs within one period of the leading edge of the Fref signal 313). However, by the time the fourth reference cycle begins (point 907), the frequency divider output signal 315 has started to fall substantially behind. Consequently, at point 907, the SOURCE signal 801 is asserted, and subsequently remains asserted for at least an entire cycle time of the Fref signal 313 because the fourth leading edge of the frequency divider output signal 315 does not occur until the substantially delayed point 909. The presence of an asserted SOURCE signal 801 concurrent with a rising edge of the Fref signal 313 causes the first flip-flop 809 to generate an asserted signal (e.g., "1") at its output. This signal propagates through the OR-gate 817 and the divider 819 (because the divider 819 is dividing by one), and eventually serves as a clock pulse which raises the pulse skip signal 823 (see point 909 in FIG. 9) at the output of the latch 821.

The above-described techniques for tuning a PLL bandwidth are best applied when the following conditions are satisfied:

1) The frequency of the Fref signal 313 and the operating bandwidth determine how large a change in division factor needs to be utilized in the frequency divider 311 in order to perform a frequency step that generates a pulse skip.
2) The range of the controllable charge pump 305 should be wide enough to cope with frequency steps equaling the frequency of the Fref signal 313 and multiples of it.
3) The VCO 309 must be able to handle the frequency range covered by the frequency step used when tuning the loop.

The invention has been described with reference to a particular embodiment. However, it will be readily apparent to those skilled in the art that it is possible to embody the invention in specific forms other than those of the preferred embodiment described above. This may be done without departing from the spirit of the invention.

For example, the inducement of a step response has been described with respect to an exemplary embodiment in which, after allowing the PLL 301 to become phase-locked, the division factor is increased by some number (e.g., increased by one). However, a step response may also be applied by decreasing, rather than increasing, the division factor.

Furthermore, in the above-described embodiments, the occurrence of a pulse skip has been used as the "measured" parameter related to the step response for determining the loop bandwidth. However, the use of the pulse skip is not essential to practicing the invention. Rather, any parameter related to the step response can alternatively be used as an indicator of the loop bandwidth.

Still further, the techniques described above are useful for purposes other than tuning a PLL. For example, even after a PLL has been tuned, the output of the pulse skip detector 323 may be useful for providing an indication of whether the bandwidth of the PLL has deviated (e.g., because of changing operating temperatures) from its desired operating value.

Thus, the preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A method for tuning a phase-locked loop bandwidth to a desired level, comprising the steps of:
   a) operating the phase-locked loop in a phase-locked condition at a first frequency;
   b) applying a step response to the phase-locked loop by causing the phase-locked loop to begin locking to a second frequency that is different from the first frequency;
   c) detecting a parameter that is related to the applied step response and that is indicative of whether the phase-locked loop bandwidth is at the desired level; and
   d) adjusting the phase-locked loop bandwidth and repeating steps a) through d) until the phase-locked loop bandwidth is at the desired level.

2. The method of claim 1, further comprising the step of adjusting the phase-locked loop bandwidth by a predetermined amount, thereby tuning the phase-locked loop bandwidth to an operational level.

3. The method of claim 1, wherein the step of applying the step response to the phase-locked loop comprises changing a frequency division value in a feedback path of the phase-locked loop.

4. The method of claim 1, wherein the step of detecting the parameter that is related to the applied step response comprises the step of detecting whether a pulse skip occurs.

5. The method of claim 4, wherein the step of adjusting the phase-locked loop bandwidth and repeating steps a) through d) until the phase-locked loop bandwidth is at the desired level comprises the step of adjusting the phase-locked loop bandwidth and repeating steps a) through d) until no pulse skip is detected when the step response is applied to the phase-locked loop.

6. The method of claim 4, wherein the step of detecting whether the pulse skip occurs comprises the step of:
   detecting whether two leading edges of a phase-locked loop reference frequency signal occur in succession without an occurrence of a leading edge of a phase-locked loop feedback signal.

7. The method of claim 6, wherein the step of detecting whether the pulse skip occurs further comprises the step of:
   detecting whether two leading edges of a phase-locked loop feedback signal occur in succession without an occurrence of a leading edge of a phase-locked loop reference frequency signal.

8. The method of claim 6, wherein the step of detecting whether two leading edges of the phase-locked loop reference frequency signal occur in succession without the occurrence of the leading edge of the phase-locked loop feedback signal comprises the steps of:
   asserting a source signal in response to occurrence of a first leading edge of the phase-locked loop reference frequency signal;
   asserting a sink signal in response to occurrence of the leading edge of the phase-locked loop feedback signal;
   deasserting the source signal and the sink signal in response to the source signal and the sink signal being concurrently asserted; and
   detecting that the source signal is asserted concurrently with an occurrence of a second leading edge of the phase-locked loop reference frequency signal.

9. The method of claim 8, wherein the step of detecting that the source signal is asserted concurrently with the occurrence of the second leading edge of the phase-locked loop reference frequency signal comprises the steps of:

delaying the source signal by a predetermined amount; and detecting that the delayed source signal is asserted concurrently with an occurrence of the second leading edge of the phase-locked loop reference frequency signal.

10. The method of claim 4, wherein the step of detecting whether the pulse skip occurs comprises the step of:

detecting whether two leading edges of a phase-locked loop feedback signal occur in succession without an occurrence of a leading edge of a phase-locked loop reference frequency signal.

11. The method of claim 10, wherein the step of detecting whether two leading edges of the phase-locked loop feedback signal occur in succession without the occurrence of the leading edge of the phase-locked loop reference frequency signal comprises the steps of:

asserting a source signal in response to occurrence of the leading edge of the phase-locked loop reference frequency signal;

asserting a sink signal in response to occurrence of a first leading edge of the phase-locked loop feedback signal;

deasserting the source signal and the sink signal in response to the source signal and the sink signal being concurrently asserted; and detecting that the sink signal is asserted concurrently with an occurrence of a second leading edge of the phase-locked loop feedback signal.

12. The method of claim 11, wherein the step of detecting that the sink signal is asserted concurrently with the occurrence of the second leading edge of the phase-locked loop feedback signal comprises the steps of:

delaying the sink signal by a predetermined amount; and detecting that the delayed sink signal is asserted concurrently with an occurrence of the second leading edge of the phase-locked loop feedback signal.

13. The method of claim 1, wherein the step of adjusting the phase-locked loop bandwidth comprises the step of adjusting a charge pump output current.

14. The method of claim 13, wherein the step of adjusting the charge pump output current comprises adjusting the charge pump output current in steps that are logarithmically spaced with respect to one another.

15. The method of claim 1, wherein the step of detecting the parameter that is related to the applied step response comprises the step of detecting whether a predetermined number of pulse skips occur, wherein the predetermined number is greater than one.

16. The method of claim 15, wherein the step of adjusting the phase-locked loop bandwidth and repeating steps a) through d) until the phase-locked loop bandwidth is at the desired level comprises the step of adjusting the phase-locked loop bandwidth and repeating steps a) through d) until fewer than the predetermined number of pulse skips are detected when the step response is applied to the phase-locked loop.

17. The method of claim 15, wherein the step of detecting whether the predetermined number of pulse skips occur comprises the steps of:

asserting a detect signal whenever two leading edges of a phase-locked loop reference frequency signal occur in succession without an occurrence of a leading edge of a phase-locked loop feedback signal;

deasserting the detect signal whenever two leading edges of the phase-locked loop reference frequency signal do not occur in succession without an occurrence of the leading edge of the phase-locked loop feedback signal; and asserting a pulse skip signal in response to the detect signal being asserted the predetermined number of times.

18. The method of claim 17, wherein the step of detecting whether the pulse skip occurs further comprises the step of:

asserting a detect signal whenever two leading edges of a phase-locked loop feedback signal occur in succession without an occurrence of a leading edge of a phase-locked loop reference frequency signal;

deasserting the detect signal whenever two leading edges of the phase-locked loop feedback signal do not occur in succession without an occurrence of the leading edge of the phase-locked loop reference frequency signal; and asserting a pulse skip signal in response to the detect signal being asserted the predetermined number of times.

19. The method of claim 17, wherein the step of asserting the detect signal whenever two leading edges of the phase-locked loop reference frequency signal occur in succession without the occurrence of the leading edge of the phase-locked loop feedback signal comprises the steps of:

asserting a source signal in response to occurrence of a first leading edge of the phase-locked loop reference frequency signal;

asserting a sink signal in response to occurrence of the leading edge of the phase-locked loop feedback signal;

deasserting the source signal and the sink signal in response to the source signal and the sink signal being concurrently asserted; and asserting the detect signal whenever the source signal is asserted concurrently with an occurrence of a second leading edge of the phase-locked loop reference frequency signal.

20. The method of claim 19, wherein the step of asserting the detect signal whenever the source signal is asserted concurrently with the occurrence of the second leading edge of the phase-locked loop reference frequency signal comprises the steps of:

delaying the source signal by a predetermined amount; and asserting the detect signal whenever the delayed source signal is asserted concurrently with an occurrence of the second leading edge of the phase-locked loop reference frequency signal.

21. The method of claim 15, wherein the step of detecting whether the predetermined number of pulse skips occur comprises the steps of:

asserting a detect signal whenever two leading edges of a phase-locked loop feedback signal occur in succession without an occurrence of a leading edge of a phase-locked loop reference frequency signal;

deasserting the detect signal whenever two leading edges of the phase-locked loop feedback signal do not occur in succession without the occurrence of the leading edge of the phase-locked loop reference frequency signal; and asserting a pulse skip signal in response to the detect signal being asserted the predetermined number of times.

22. The method of claim 21, wherein the step of asserting the detect signal whenever two leading edges of the phase-locked loop feedback signal occur in succession without the occurrence of the leading edge of the phase-locked loop reference frequency signal comprises the steps of:

asserting a source signal in response to occurrence of the leading edge of the phase-locked loop reference frequency signal;

asserting a sink signal in response to occurrence of a first leading edge of the phase-locked loop feedback signal;

deasserting the source signal and the sink signal in response to the source signal and the sink signal being concurrently asserted; and asserting the detect signal whenever the sink signal is asserted concurrently with an occurrence of a second leading edge of the phase-locked loop feedback signal.

23. The method of claim 22, wherein the step of asserting the detect signal whenever the sink signal is asserted concurrently with the occurrence of the second leading edge of the phase-locked loop feedback signal comprises the steps of:

delaying the sink signal by a predetermined amount; and asserting the detect signal whenever the delayed sink signal is asserted concurrently with an occurrence of the second leading edge of the phase-locked loop feedback signal.

24. An apparatus comprising:

a phase-locked loop that generates an output signal that has a frequency that is a function of a reference frequency and a feedback division factor; and a pulse skip detector, coupled to the phase-locked loop, that generates a pulse skip signal indicating whether a pulse skip occurred in the phase-locked loop, wherein:

the phase-locked loop includes a controllable charge pump; and further comprising a controller for:

a) operating the phase-locked loop in a phase-locked condition at a first frequency;

b) applying a step response to the phase-locked loop by causing the phase-locked loop to begin locking to a second frequency that is different from the first frequency;

c) using the pulse skip signal generated by the pulse skip detector to determine whether a pulse skip occurred, wherein whether the pulse skip occurred is indicative of whether the phase-locked loop bandwidth is at a desired level; and d) adjusting the phase-locked loop bandwidth by adjusting an output current of the controllable charge pump, and repeating steps a) through d) until the phase-locked loop bandwidth is at the desired level.

25. The apparatus of claim 24, wherein, after the phase-locked loop bandwidth is at the desired level, the controller further adjusts the output current of the controllable charge pump by a predetermined amount, thereby tuning the phase-locked loop bandwidth to an operational level.

26. The apparatus of claim 24, wherein the controller applies the step response to the phase-locked loop by changing the feedback division factor in a feedback path of the phase-locked loop.

27. An apparatus comprising:

a phase-locked loop that generates an output signal that has a frequency that is a function of a reference frequency and a feedback division factor; and a pulse skip detector, coupled to the phase-locked loop, that generates a pulse skip signal indicating whether a number, X, of pulse skips occurred in the phase-locked loop, wherein X is a predetermined number.

wherein:

the phase-locked loop includes a controllable charge pump; and further comprising a controller for:

a) operating the phase-locked loop in a phase-locked condition at a first frequency;

b) applying a step response to the phase-locked loop by causing the phase-locked loop to begin locking to a second frequency that is different from the first frequency;

c) using the pulse skip signal generated by the pulse skip detector to determine whether the number, X, of pulse skips occurred, wherein whether the number, X, of pulse skips occurred is indicative of whether the phase-locked loop bandwidth is at a desired level; and d) adjusting the phase-locked loop bandwidth by adjusting an output current of the controllable charge pump, and repeating steps a) through d) until the phase-locked loop bandwidth is at the desired level.

28. The apparatus of claim 27, wherein, after the phase-locked loop bandwidth is at the desired level, the controller further adjusts the output current of the controllable charge pump by a predetermined amount, thereby tuning the phase-locked loop bandwidth to an operational level.

29. The apparatus of claim 27, wherein the controller applies the step response to the phase-locked loop by changing the feedback division factor in a feedback path of the phase-locked loop.

30. An article of manufacture comprising a computer usable storage medium having computer readable program code means embodied therein for tuning a phase-locked loop bandwidth to a desired level, the computer readable program code means in said article of manufacture comprising:

a) computer readable program code means for causing a computer to operate the phase-locked loop in a phase-locked condition at a first frequency;

b) computer readable program code means for causing a computer to apply a step response to the phase-locked loop by causing the phase-locked loop to begin locking to a second frequency that is different from the first frequency;

c) computer readable program code means for causing a computer to detect a parameter that is related to the applied step response and that is indicative of whether the phase-locked loop bandwidth is at the desired level; and d) computer readable program code means for causing a computer to adjust the phase-locked loop bandwidth and to repeat operation of computer readable program code means a) through d) until the phase-locked loop bandwidth is at the desired level.

31. The article of manufacture of claim 30, further comprising computer readable program code means for causing a computer to adjust the phase-locked loop bandwidth by a predetermined amount, thereby tuning the phase-locked loop bandwidth to an operational level.

32. The article of manufacture of claim 30, wherein the computer readable program code means for causing the computer to apply the step response to the phase-locked loop comprises computer readable program code means for causing a computer to change a frequency division value in a feedback path of the phase-locked loop.

33. The article of manufacture of claim 30, wherein the computer readable program code means for causing the computer to detect the parameter that is related to the applied step response comprises computer readable program code means for causing the computer to detect whether a pulse skip occurs.

34. The article of manufacture of claim 33, wherein the computer readable program code means for causing the computer to adjust the phase-locked loop bandwidth and to repeat operation of computer readable program code means a) through d) until the phase-locked loop bandwidth is at the desired level comprises computer readable program code means for causing the computer to adjust the phase-locked loop bandwidth and to repeat operation of computer readable program code means a) through d) until no pulse skip is detected when the step response is applied to the phase-locked loop.

* * * * *